United States Patent [19]
Sardella

[11] Patent Number: 5,869,175
[45] Date of Patent: Feb. 9, 1999

[54] INTEGRATED CIRCUIT STRUCTURE HAVING TWO PHOTORESIST LAYERS

[75] Inventor: John C. Sardella, Highland Village, Tex.

[73] Assignee: STMicroelectronics, Inc., Carrollton, Tex.

[21] Appl. No.: 441,778

[22] Filed: May 16, 1995

Related U.S. Application Data

[62] Division of Ser. No. 189,184, Jan. 31, 1994, abandoned.

[51] Int. Cl.$^6$ ........................................................ G03C 5/00
[52] U.S. Cl. .................................. 430/319; 430/9; 430/11; 430/12; 430/16; 430/313; 430/318; 430/311; 430/312; 430/329; 430/333
[58] Field of Search .................................. 430/9, 11, 12, 430/16, 311, 312, 313, 318, 319, 329, 333

[56] References Cited

U.S. PATENT DOCUMENTS

| | | | |
|---|---|---|---|
| 4,362,809 | 12/1982 | Chen et al. | 430/312 |
| 4,434,224 | 2/1984 | Yoshikawa et al. | 430/312 |
| 4,770,739 | 9/1988 | Orvek et al. | 156/643 |
| 4,906,552 | 3/1990 | Ngo et al. | 430/312 |
| 4,997,746 | 3/1991 | Greco et al. | 430/318 |
| 5,091,289 | 2/1992 | Cronin et al. | 430/312 |
| 5,310,622 | 5/1994 | Sardella | 430/311 |

OTHER PUBLICATIONS

Moreau, Microdevices Physics and Fabrication Technologies, Semiconductor Lithography Principles, Practices and Materials, 1987, pp. 605–606; 627–628 and 907, 910.

Keller, Solid State Technology, "Functional Testing of Positive Photoresist for Manufacture of Film Integrated Circuits", Jun. 1987, pp. 45–53.

Ching et al., J. Appl. Phys., "Improvement of Linewidth Control With Antireflective Coating in Optical Lithography", vol. 55, No. 4, Feb. 1984, pp. 1110–1115.

Lin et al, SPIE, "Some Aspects of Anti–Reflective Coating for Optical Lithography", vol. 469, 1984, pp. 30–37.

Listvan et al., SPIE, "Multiple Layer Techniques in Optical Lithography: Applications to Fine Line Mos Production", vol. 470, 1984, pp. 85–90.

*Primary Examiner*—Geraldine Letscher
*Attorney, Agent, or Firm*—Theodore E. Galanthay; Kenneth C. Hill; Lisa K. Jorgenson

[57] ABSTRACT

A structure formed during processing of an integrated circuit. Two layers of photoresist are formed over a conductive layer to be patterned. The lower layer is thinner than the upper layer, and is dyed to have a lower transmittance. Both layers are used as a masking pattern for the underlying conductive layer.

15 Claims, 1 Drawing Sheet

INTEGRATED CIRCUIT STRUCTURE HAVING TWO PHOTORESIST LAYERS

This is a Division, of application Ser. No. 08/189,184, filed Jan. 31, 1994, now abandoned.

BACKGROUND OF THE INVENTION

1. Field of the Invention

The present invention relates generally to the fabrication of integrated circuits, and more particularly to a method for patterning a reflective surface in an integrated circuit.

2. Description of the Prior Art

Proper signal line patterning is important to the operation of an integrated circuit. Reflections off the surface of a metal layer during exposure of an overlying photoresist layer, however, can subsequently cause problems with the formation of the signal line.

Reflection problems are intensified on integrated circuits having hills and valleys on the surface. The sidewalls of the steps reflect the heat, light or radiation at various angles into the photoresist, resulting in poor image resolution. Poor image resolution is especially undesirable in complex integrated circuits, due to the importance of maintaining critical dimensions. Furthermore, those skilled in the art will recognize that notching, or a thinning of the signal line, typically occurs as a result of the reflections. Notching is especially a problem when the patterned signal line crosses a step. As known in the art, notching can lead to electromigration and other device failure mechanisms.

Techniques which have been used to solve reflection problems include the use of an anti-reflective coating on the surface of the metal layer, or on the bottom or the top of the photoresist layer. These techniques, however, are not completely successful in integrated circuits having a varied topography. As known in the art, the photoresist layer is thicker in the valleys on the surface of the integrated circuit. Therefore, it is necessary to overexpose the photoresist in order to allow the radiation to reach the photoresist located at the bottom of the valleys. This overexposure, however, can increase the amount of reflections from the metal layer.

Therefore, it would be desirable to provide a method for patterning reflective surfaces in integrated circuits which reduces the reflections into a photoresist layer. It is also desirable that such a method not significantly increase the complexity of the fabrication process.

SUMMARY OF THE INVENTION

A method is provided for patterning a reflective surface in an integrated circuit. A first photoresist layer is formed over a conductive layer in the integrated circuit. A second photoresist layer is then formed over the first photoresist layer, where the transmittance of the first photoresist layer is less than the transmittance of the second photoresist layer. The first and second photoresist layers are exposed to define a masking pattern, and portions of the first and second masking layers are then removed to form a mask which corresponds to the masking pattern. Finally, the conductive layer is patterned using the mask formed by the first and second photoresist layers.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
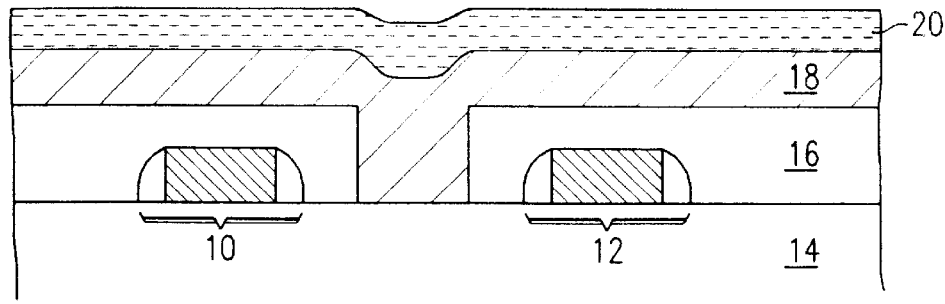
FIGS. 1–4 are cross sectional views of an integrated circuit illustrating a preferred method for patterning a reflective surface in an integrated circuit.

FIGS. 1–4 are cross sectional views of an integrated circuit illustrating a preferred method for patterning a reflective surface in an integrated circuit. Referring to FIG. 1, conductive elements 10, 12 are formed on an underlying region 14 in an integrated circuit. The underlying region 14 can be either a semiconductor substrate or another conductive structure.

An insulating layer 16 is then formed over the integrated circuit. The insulating layer 16 can be made of, for example, oxide or spin on glass. Next, an opening is created through the insulating layer 16 to expose a portion of the underlying region 14. A conductive layer 18 is then deposited over the integrated circuit and extends into the opening to make electrical contact with a portion of the underlying region 14. In the preferred embodiment, the conductive layer 18 is made of a material which has a reflective surface, such as a metal. A first photoresist layer 20 is then deposited over the conductive layer 18.

Figure 2:
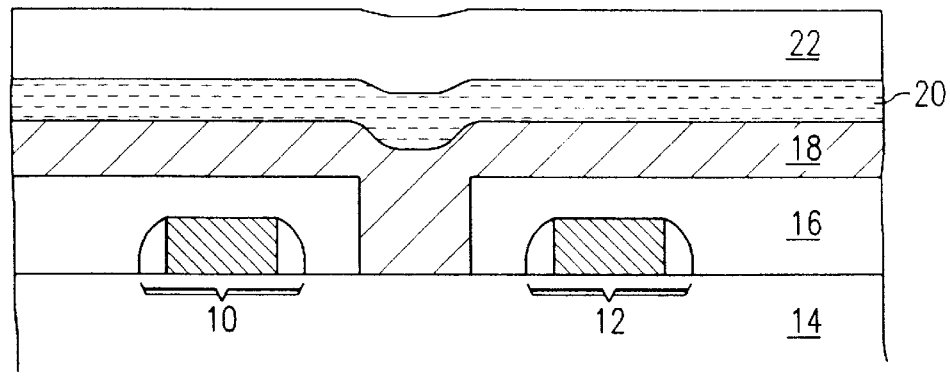

FIG. 2 illustrates the integrated circuit after a second photoresist layer 22 is deposited over the first photoresist layer 20. In the preferred embodiment, the first photoresist layer 20 has a thickness of approximately 2250 angstroms and the second photoresist layer 22 has a thickness of approximately 16,400 angstroms. Furthermore, the transmittance of the first photoresist layer 20 is less than the transmittance of the second photoresist layer 22.

For example, the first photoresist layer 20 is dyed and the second photoresist layer 22 is either not dyed or lightly dyed. If the second photoresist layer 22 is lightly dyed, it is preferable that the first photoresist layer 20 contain two to three times more dye than the second photoresist layer 22.

Figure 3:
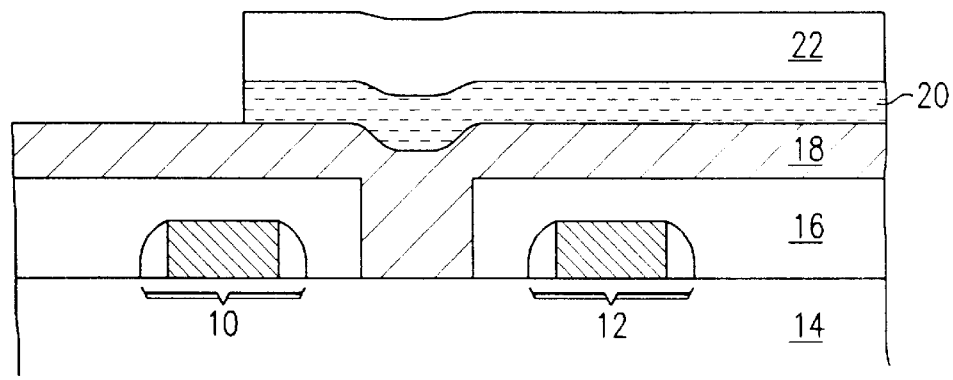

Referring to FIG. 3, the first 20 and second 22 photoresist layers are exposed to radiation, and portions of the first 20 and second 22 photoresist layers are then removed to define a masking pattern. The term radiation includes such photolithography methods as visible or ultraviolet light, x-ray, or electron beam. Those skilled in the art will recognize that if the first 20 and second 22 photoresist layers are negative resists, the unexposed portions of the first 20 and second 22 photoresist layers are removed, and if the first 20 and second 22 photoresist layers are positive resists, the exposed portions of the first 20 and second 22 photoresist layers are removed.

Because the second photoresist layer 22 is clear or lightly dyed, and the first photoresist layer 20 is a thin more heavily dyed photoresist, the total amount of radiation needed to expose the first 20 and second 22 photoresist layers is less than if one dyed photoresist layer is utilized. This is due to the fact that the second photoresist layer 22 is clear or lightly dyed and is therefore easily exposed, and the first photoresist layer 20 is thin enough to be easily exposed and removed, thereby eliminating the need to overexpose the first 20 and second 22 photoresist layers. This feature reduces the amount of reflections from the conductive layer 18. Finally, because the first photoresist layer 20 is darker than the second photoresist layer 22, the first photoresist layer 20 absorbs any reflections from the surface of the conductive layer 18 during exposure of the first 20 and second 22 photoresist layers. By absorbing the reflections from the surface of the conductive layer 18, the image resolution of the masking pattern is greatly improved.

Figure 4:
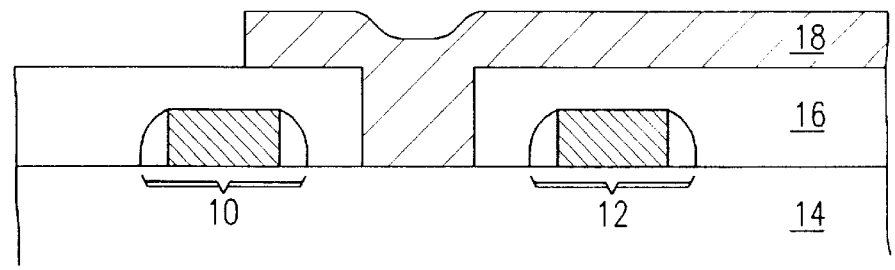

FIG. 4 illustrates the integrated circuit after the conductive layer 18 is patterned and the first 20 and second 22 photoresist layers are removed. The integrated circuit is now ready for further processing.

While the invention has been particularly shown and described with reference to a preferred embodiment, it will be understood by those skilled in the art that various changes in form and detail may be made therein without departing from the spirit and scope of the invention.

What is claimed is:

1. A structure used in fabricating an integrated circuit structure, comprising:

an insulating layer overlying a plurality of conductive structures in an integrated circuit substrate;

a metallic conductor layer overlying the insulating layer;

a first photoresist layer overlying the conductor layer, wherein the first photoresist layer has a first thickness and a first transmittance to a radiation; and a second photoresist layer overlying and in contact with the first photoresist layer, wherein the second photoresist layer has a second thickness and a second transmittance to the radiation, wherein the second thickness is greater than the first thickness, and wherein the second transmittance is greater than the first transmittance.

2. The structure of claim 1, wherein the first thickness is approximately 2250 angstroms, and the second thickness is approximately 16,400 angstroms.

3. The structure of claim 1, wherein the second photoresist layer is undyed.

4. The structure of claim 1, wherein the second photoresist layer is lightly dyed, and wherein the first photoresist layer contains at least twice as much dye as the second photoresist layer.

5. An interconnect structure for an integrated circuit, comprising:

an insulating layer having a step therein;

a patterned metal interconnect layer overlying a portion of the insulating layer, and extending over the step;

a lower layer of photoresist on the patterned metal interconnect layer and coextensive therewith, the lower layer having a first transmittance to a radiation and a first thickness; and a second layer of photoresist on and in contact with the lower layer of photoresist and coextensive therewith, wherein the second layer of photoresist has a second transmittance to the radiation greater than the first transmittance to the radiation, and has a second thickness greater than the first thickness.

6. The structure of claim 5, wherein the second photoresist layer is lightly dyed, and wherein the lower photoresist layer contains between 2 and 3 times more dye than the second photoresist layer.

7. The structure of claim 5, wherein the first thickness is approximately 2250 angstroms, and the second thickness is approximately 16,400 angstroms.

8. The structure of claim 5, wherein the insulating layer comprises oxide.

9. The structure of claim 5, wherein the insulating layer comprises spin-on-glass.

10. The structure of claim 5, wherein the patterned metal interconnect layer does not exhibit notching where it extends over the step.

11. The structure of claim 5, wherein the second photoresist layer is undyed.

12. A structure used in fabricating an integrated circuit, comprising:

an insulating layer overlying an integrated circuit substrate;

a metallic conductor layer overlying the insulating layer;

a first photoresist layer overlying the conductor layer, wherein the first photoresist layer has a first dye concentration; and a second photoresist layer overlying and in contact with the first photoresist layer, wherein the second photoresist layer has a second dye concentration, wherein the first dye concentration is at least two times the second dye concentration.

13. The structure of claim 12, wherein the second dye concentration is zero.

14. The structure of claim 12, wherein the second photoresist layer is clear.

15. The structure of claim 12, wherein the first dye concentration is two to three times the second dye concentration.

* * * * *